US008653559B2

(12) United States Patent
Corrion et al.

(10) Patent No.: US 8,653,559 B2
(45) Date of Patent: Feb. 18, 2014

(54) ALGAN/GAN HYBRID MOS-HFET

(75) Inventors: Andrea Corrion, Oak Park, CA (US);
Karim S. Boutros, Moorpark, CA (US);
Mary Y. Chen, Oak Park, CA (US);
Samuel J. Kim, Torrance, CA (US);
Rongming Chu, Newbury Park, CA (US); Shawn D. Burnham, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 308 days.

(21) Appl. No.: 13/171,798

(22) Filed: Jun. 29, 2011

(65) Prior Publication Data

US 2013/0001646 A1  Jan. 3, 2013

(51) Int. Cl.
*H01L 29/66* (2006.01)
*H01L 21/338* (2006.01)

(52) U.S. Cl.
USPC ............... 257/192; 257/194; 257/E29.246; 257/E29.249; 257/E21.407; 438/167; 438/172

(58) Field of Classification Search
USPC ............. 257/192, 194, E29.246, E29.249, 257/E21.407; 438/167, 172
See application file for complete search history.

(56) References Cited

U.S. PATENT DOCUMENTS

| 8,124,505 | B1 | 2/2012 | Burnham | |
| 8,227,833 | B2 * | 7/2012 | Dewey et al. | 257/192 |
| 2005/0023555 | A1 | 2/2005 | Yoshida et al. | |
| 2008/0258243 | A1 | 10/2008 | Kuroda et al. | |
| 2010/0012977 | A1 | 1/2010 | Derluyn et al. | |
| 2010/0025730 | A1 | 2/2010 | Heikman et al. | |

OTHER PUBLICATIONS

ISR and WO mailed on Nov. 26, 2012 for related PCT/US2012/037833.
PCT International Preliminary Report on Patentability (IPRP) for PCT PCT/US2012/037833 mailed on May 23, 2013 (25 pages).
U.S. Appl. No. 12/909,497, filed Oct. 21, 2010.
K.S. Boutros, S. Burnham, D. Wong, K. Shinohara, B. Hughes, D. Zehnder, and C. Mcguire, "Normally-off 5A/1100V GaN-on-Silicon Device for high Voltage applications", International Electron Devices Meeting 2009.
H. Kambayashi, Y. Satoh, S. Ootomo, T. Kokawa, T. Nomura, S. Kato, and T.P. Chow, "Over 100A normally-off AlGaN/GaN hybrid MOS-HFET on Si substrate with high-breakdown voltage", Solid State Elec., vol. 54 issue 6 pp. 660-664 (2010).
T. Oka and T. Nozawa, "AlGaN/GaN recessed MIS-Gate HFET with high threshold voltage normally-off operation for power electronics applications", IEEE Elec Dev. Lett. vol. 29 No. 7 (2008).

(Continued)

*Primary Examiner* — Minh-Loan T Tran
(74) *Attorney, Agent, or Firm* — Ladas & Parry (57) ABSTRACT

A field effect transistor (FET) includes source and drain electrodes, a channel layer, a barrier layer over the channel layer, a passivation layer covering the barrier layer for passivating the barrier layer, a gate electrode extending through the barrier layer and the passivation layer, and a gate dielectric surrounding a portion of the gate electrode that extends through the barrier layer and the passivation layer, wherein the passivation layer is a first material and the gate dielectric is a second material, and the first material is different than the second material.

24 Claims, 7 Drawing Sheets

(56) References Cited

OTHER PUBLICATIONS

X. Hu, A. Koudymov, G. Simin, J. Yang, and M. Asif Khan, "Si3N4/AlGaN/GaN metal-insulator-semiconductor heterostructure field-effect transistors", Applied Phys. Lett., vol. 79 No. 17 p. 2832 (2001).

Y. Pei, S. Rajan, M. Higashiwaki, Z. Chen, S.P. DenBaars, and U.K. Mishra, "Effect of dielectric thickness on power performance of AlGaN/GaN HEMTs", IEEE Elec Dev. Lett. vol. 30 No. 4 (2009.

* cited by examiner

ALGAN/GAN HYBRID MOS-HFET

TECHNICAL FIELD

This disclosure relates to heterostructure field effect transistors (HFET), which are also known as high electron mobility transistors (HEMTs), and in particular to normally-off type HFET transistors.

BACKGROUND

GaN-based transistors are typically of the normally-on type due to the spontaneous formation of a polarization-doped two dimensional electron gas (2DEG) at the AlGaN/GaN interface. However, normally-off type devices are desirable in a number of applications and particularly in high voltage power-switching applications, where the normally-off functionality reduces power consumption and improves safety. High-voltage power-switching devices also require a high breakdown voltage in addition to a low on-resistance. Methods of making AlGaN/GaN transistors normally-off include gate recess etching, fluorine plasma exposure, the use of thin or low Al-composition AlGaN barrier layers, p-type depletion layers, etc. Any method for fabrication of a normally-off device should ideally not compromise the breakdown voltage of the device and should maintain a low on-resistance. Another issue is charge trapping at the drain side of the gate, which can result in a phenomenon known as "current collapse" under high-voltage operation. To avoid current collapse, the surface of the device must be passivated by a dielectric material that has a high-quality interface with GaN (typically SiN).

The prior art includes flourine-treated normally-off type GaN devices, as described by K. S. Boutros, S. Burnham, D. Wong, K. Shinohara, B. Hughes, D. Zehnder, and C. Mcguire, "Normally-off 5 A/1100V GaN-on-Silicon Device for high Voltage applications", International Electron Devices Meeting 2009; and hybrid MOS-HFET devices which utilize a single dielectric layer as a gate insulator and surface passivation layer as described by H. Kambayashi, Y. Satoh, S. Ootomo, T. Kokawa, T. Nomura, S. Kato, and T. P. Chow, "Over 100 A normally-off AlGaN/GaN hybrid MOS-HFET on Si substrate with high-breakdown voltage", Solid State Elec., vol. 54 issue 6 pp. 660-664 (2010), and T. Oka and T. Nozawa, "AlGaN/GaN recessed MIS-Gate HFET with high threshold voltage normally-off operation for power electronics applications", IEEE Elec Dev. Lett. vol. 29 no. 7 (2008).

The disadvantages of Flourine-treated devices include poor threshold voltage uniformity and reliability. The disadvantages of prior art MOS-HFET devices, which use a thick $SiO_2$ or SiN layer as both a gate dielectric and a passivation layer, include poor channel mobility and on-resistance due to a poor quality, thick, low k dielectric under the gate, as well as poor surface passivation by $SiO_2$, and threshold voltage hysteresis due to a poor quality interface between the gate dielectric and underlying epitaxial material.

These types of "hybrid" MOS- or MIS-HFET devices are known to result in a normally-off device with a high breakdown voltage. However, these hybrid MOS-HFET devices have the disadvantage of low electron mobility in the active region under the gate due to a poor quality interface between the gate dielectric and the underlying GaN, resulting in increased on-resistance compared to a traditional GaN HFET.

What is needed is a device with a normally-off operation with low gate current, high breakdown voltage, and low on-resistance, as well as low threshold voltage hysteresis and current collapse. The embodiments of the present disclosure answer these and other needs.

SUMMARY

In a first embodiment disclosed herein, a field effect transistor (FET) comprises a source electrode, a drain electrode, a channel layer, a barrier layer over the channel layer and coupled to the source and drain electrodes, a passivation layer over the barrier layer for passivating the barrier layer between the gate electrode and the source electrode and between the gate electrode and the drain electrode, a gate electrode extending through the barrier layer and the passivation layer, and a gate dielectric surrounding the portion of the gate electrode that extends through the barrier layer and the passivation layer, wherein the passivation layer is a first material and the gate dielectric is a second material, and wherein the first material is different than the second material.

In another embodiment disclosed herein, a method of fabricating a field effect transistor comprises forming a channel layer, forming a barrier layer over the channel layer, forming a passivation layer over the barrier layer, etching away a first area of the passivation layer for a source electrode and a second area of the passivation layer for a drain electrode, forming a source electrode and a drain electrode on the barrier layer, etching away a third area of the passivation layer and a fourth area extending through the barrier layer for a gate electrode, forming a gate dielectric on the surface of the third area and the fourth area, and forming a gate electrode in the third area and in the fourth area, wherein the passivation layer is a first material and the gate dielectric is a second material, and wherein the first material is different than the second material.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
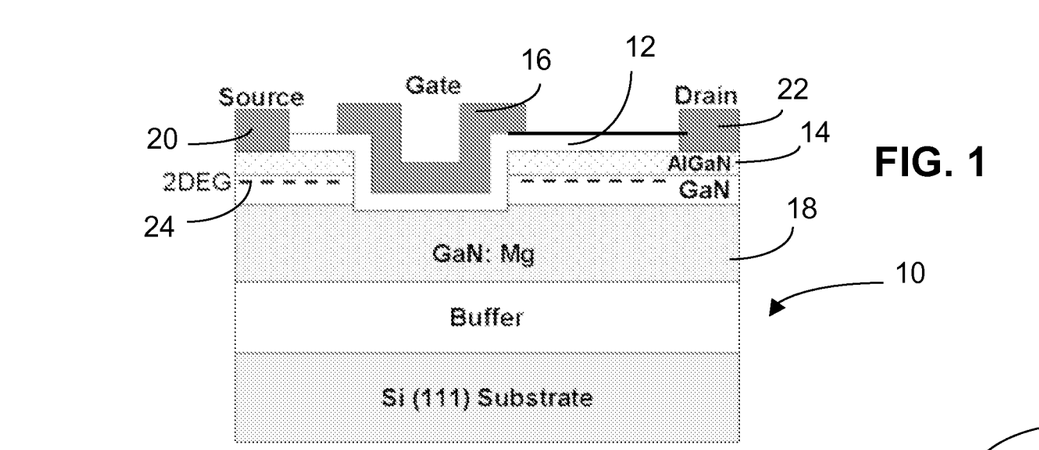
FIG. 1 shows an elevation sectional view of a hybrid MOS-HFET with a layer used as both a gate dielectric and a passivation layer in accordance with the prior art.

FIG. 1 shows an elevation sectional view of a hybrid MOS-HFET 10 with a layer 12 used for both surface passivation of the AlGaN layer 14 between the gate 16 and source 20 and drain 22 electrodes and as a gate dielectric beneath gate 16 in accordance with the prior art. In the prior art for hybrid AlGaN/GaN MOS- or MIS-HFETs, the layer 12 may be a plasma enhanced chemical vapor deposition (PECVD) SiN or $SiO_2$ layer 12 and be greater than 20 nm thick. The result the use of the layer 12 as both a surface passivation layer and a gate dielectric is a low-mobility channel with high on-resistance and low $g_m$. In addition, prior art MIS-HFETs can suffer from threshold voltage hysteresis related to a poor quality interface between the layer 12 and the GaN epi layer 18.

The prior art method of fabricating a normally-off low on-resistance GaN HFET, involves etching completely through the AlGaN barrier layer 14 in the gate 16 region of the device and depositing a gate dielectric material 12, which forms an MOS-type interface in the channel under the gate, as described in H. Kambayashi, Y. Satoh, S. Ootomo, T. Kokawa, T. Nomura, S. Kato, and T. P. Chow, "Over 100 A normally-off AlGaN/GaN hybrid MOS-HFET on Si substrate with high-breakdown voltage", Solid State Elec., vol. 54 issue 6 pp. 660-664 (2010), and T. Oka and T. Nozawa, "AlGaN/GaN recessed MIS-Gate HFET with high threshold voltage normally-off operation for power electronics applications", IEEE Elec Dev. Lett. vol. 29 no. 7 (2008). Away from the gate 16 the AlGaN barrier layer 14 induces a high-density high-mobility 2DEG 24, which results in low on-resistance. Although the prior art "hybrid" MOS- or MIS-HFET devices have been shown to result in normally-off operation with high breakdown voltage, the prior art hybrid MOS-HFET devices have the disadvantage of a low electron mobility in the active region under the gate due to a poor quality interface between the gate dielectric 12 and the underlying GaN layer 18, resulting in increased on-resistance compared to a traditional GaN HFET. The performance of such "hybrid" MOS-HFET devices therefore is extremely sensitive to the quality of the gate dielectric 12 and its interface with the underlying channel layer. As shown in FIG. 1 the GaN layer 18 may be doped with magnesium (Mg).

Figure 2:
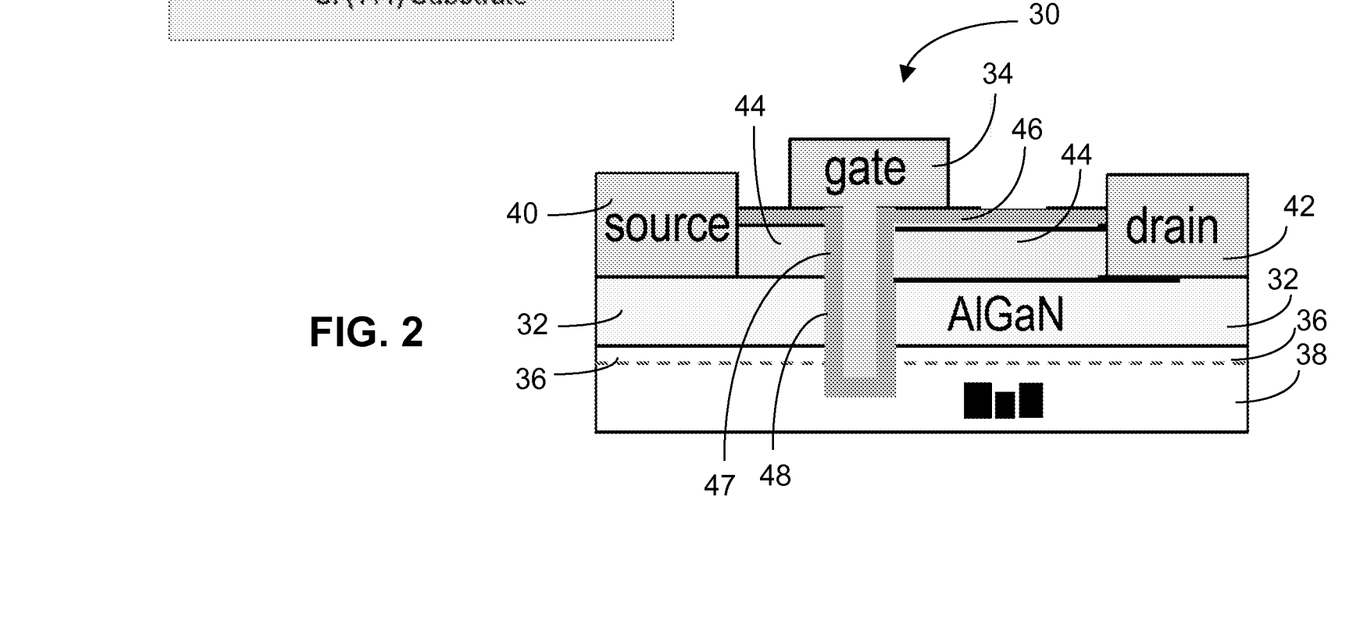
FIG. 2 shows an elevation sectional view of a hybrid MOS-HFET in accordance with the present disclosure.

FIG. 2 shows an elevation sectional view of a hybrid MOS-HFET 30 in accordance with the present disclosure. The AlGaN barrier layer 32, which also may be formed of AlN, AlInN, a combination of AlN spacer and AlGaN barrier, or a combination of AlN spacer and InAlN barrier, in the gate 34 region of the device is completely etched, resulting in normally-off operation, while a low on-resistance is maintained by the presence of a polarization-induced 2DEG 36 in the access regions between the AlGaN barrier layer 32 and the GaN channel layer 38, and away from the gate 34. The channel layer 38 may also be formed of InN, or InGaN, may be a 0001 oriented GaN layer, and in a preferred embodiment is not doped with magnesium. A passivation layer 44, which may be PECVD SiN, $SiO_2$, $Al_2O_3$, $HfO_2$, $TiO_2$, amorphous AlN, or polycrystalline AlN, and which may be about 20-100 nm thick, is used to passivate the AlGaN layer 32 between the gate 34 and source 40 and drain 42.

A gate dielectric 46, which may be $Al_2O_3$, or may be hafnium oxide ($HfO_2$), titanium oxide ($TiO_2$), SiN, $SiO_2$, amorphous AlN, or polycrystalline AlN, surrounds the gate 34 and also covers the passivation layer 44 in the embodiment shown in FIG. 2. In another embodiment the gate dielectric 46 only surrounds the gate 34 and does not cover the passivation layer 44. Having a separate passivation layer 44 and gate dielectric 46 is in contrast to prior art devices which use the same thick layer 12, as shown in FIG. 1, as both a passivation layer and gate dielectric.

In the present disclosure the gate dielectric and surface passivation layers are different materials, and may be deposited by different deposition techniques, allowing independent optimization of gate characteristics and current collapse, respectively. The gate dielectric 46 may be deposited using atomic layer deposition (ALD), which has advantages compared to PECVD, and may consist of a high-k material such as $Al_2O_3$. $Al_2O_3$ has a higher dielectric constant of approximately 9-10, compared to $SiO_2$, which has a dielectric constant of approximately 6-7. In addition $Al_2O_3$ has a larger bandgap of approximately 7 eV, compared to approximately 5 eV for $SiO_2$, making $Al_2O_3$ a superior gate dielectric material.

As further described below, hybrid MOS-HFETs in accordance with the present disclosure have been fabricated and tested with a SiN surface passivation layer 44 in combination with an ALD $Al_2O_3$ gate dielectric 46, with the $Al_2O_3$ gate dielectric 46 annealed after deposition for improved oxide/epi interface quality. The test results indicate that hybrid MOS-HFETs in accordance with the present disclosure are normally-off with low gate current, high $g_m$, high drain current, low current collapse, low hysteresis, low on-resistance, and high breakdown voltage. Together the results indicate that hybrid MOS-HFETs in accordance with the present disclosure have an approximately seven times (7×) improvement in $Vb^2/R_{on}$ figure-of-merit over the prior art hybrid MOS-HFET structures.

As described above, the hybrid MOS-HFETs in accordance with the present disclosure have gate dielectric and surface passivation layers that are different materials and that may be deposited by different deposition techniques, allowing independent optimization of gate characteristics and current collapse, respectively. The characteristics which make good surface passivation layers and good gate dielectrics are very different. Due to uncontrolled oxidation of the epi surface during deposition, oxygen-containing materials such as $SiO_2$ typically result in inferior surface passivation of GaN devices and poor current collapse suppression compared to oxygen-free materials, such as SiN, as described by X. Hu, A. Koudymov, G. Simin, J. Yang, and M. Asif Khan, "Si3N4/AlGaN/GaN metal-insulator-semiconductor heterostructure field-effect transistors", Applied Phys. Lett., vol. 79 no. 17 p. 2832 (2001).

Optimal surface passivation layers are typically at least 30-50 nm thick in order to remove the surface of the dielectric, which can be a source of charging due to ionization of air, from the active region of the device as described by Y. Pei, S. Rajan, M. Higashiwaki, Z. Chen, S. P. DenBaars, and U. K. Mishra, "Effect of dielectric thickness on power performance of AlGaN/GaN HEMTs", IEEE Elec Dev. Lett. vol. 30 no. 4 (2009).

Finally, low dielectric constants are desired for surface passivation layers in order to reduce parasitic capacitances, particularly for high-frequency applications. Gate insulator dielectrics, on the other hand, ideally have high dielectric constants and low thickness to achieve high device transconductance, in addition to a large bandgap and large band offset with the channel layer in order to reduce gate current. Uniformity, thickness control, and a low interface density of states (Dit) are critical gate insulator properties—especially for MOS-type devices, in which the conduction electrons are confined directly by the dielectric. For low leakage current, gate insulator dielectrics should be amorphous, as grain boundaries have been shown to act as leakage paths. Suitable high-k dielectrics with large bandgaps for electron confinement include amorphous oxides such as $Al_2O_3$, $HfO_2$, and $TiO_2$, which have been studied extensively for GaAs III-V and Si MOSFETs. The atomic layer deposition (ALD) deposition technique is ideally suited to deposition of gate dielectrics due to excellent conformality, thickness control, low deposition temperature (thermal processing budget), and plasma-free deposition, which avoids plasma-induced damage of the underlying epi. The extremely low deposition rates in ALD (~1 A/cycle) make it suitable for very thin (<20 nm thick) films. In contrast, typically, $SiO_2$ and SiN passivation layers are deposited by plasma-enhanced CVD techniques (PEVCD), which result in much high deposition rates but relatively poor film quality due to the high-energy plasma environment during deposition. Other techniques for deposition include metal-organic chemical vapor deposition (MOVCD), atomic layer deposition (ALD), molecular beam epitaxy (MBE), e-beam evaporation, and sputtering.

In the hybrid MOS-HFET of the present disclosure, the AlGaN barrier layer 32 may be etched away to the channel layer 38 in the gate region using an atomic layer etching (ALE) technique, eliminating the polarization-induced 2DEG 36 under the gate electrode 34 only. The atomic layer etching (ALE) technique is described in U.S. patent application Ser. No. 12/909,497 filed Oct. 21, 2010, which is incorporated herein as though set forth in full. The lack of a 2DEG 36 at zero-bias conditions on the gate 34 results in normally-off operation, while surface passivation 44 in the access region between the gate 34 and the source 40 and between the gate 34 and the drain 42 results in low current collapse. The high density 2DEG 36 remains in the access regions under the device under the AlGaN barrier layer 32, resulting in a low on-resistance. The gate 34 is insulated from the channel by an amorphous gate dielectric layer 46. The device is considered a "hybrid" MOS-HFET structure because the electrons under the gate 34 and in the GaN 38 channel are directly in contact with the gate dielectric 46 as in a MOS device, while the electrons in the access regions away from the gate are confined by the wide bandgap AlGaN layer 32 and form a high-mobility 2DEG 36, as in an HFET device.

In one embodiment of the hybrid MOS-HFET of the present disclosure, the gate dielectric 46 may be 2-20 nm-thick ALD $Al_2O_3$, and the passivation layer may be 20-100 nm-thick PECVD SiN. An optimized post-deposition anneal process, in which the $Al_2O_3$ is annealed immediately following deposition may be used. The anneal process improves the $Al_2O_3$/GaN interface and results in reduced electron trap density and increased channel mobility compared to unannealed $Al_2O_3$. Test results show a normally-off with low on-resistance, high breakdown voltage, very low current collapse, low gate current, and drain current and transconductance, and a figure of merit $Vb^2/R_{on,sp}$, where Vb is the breakdown voltage and $R_{on,sp}$ is the on-resistance normalized by the area of the transistor, equal to 260 MW/cm2, which as discussed above is approximately a 7-fold improvement over prior art hybrid MOS-HFET devices, which typically use a 60 nm-thick PECVD $SiO_2$ as both a gate dielectric and surface passivation layer.

Figure 3A:
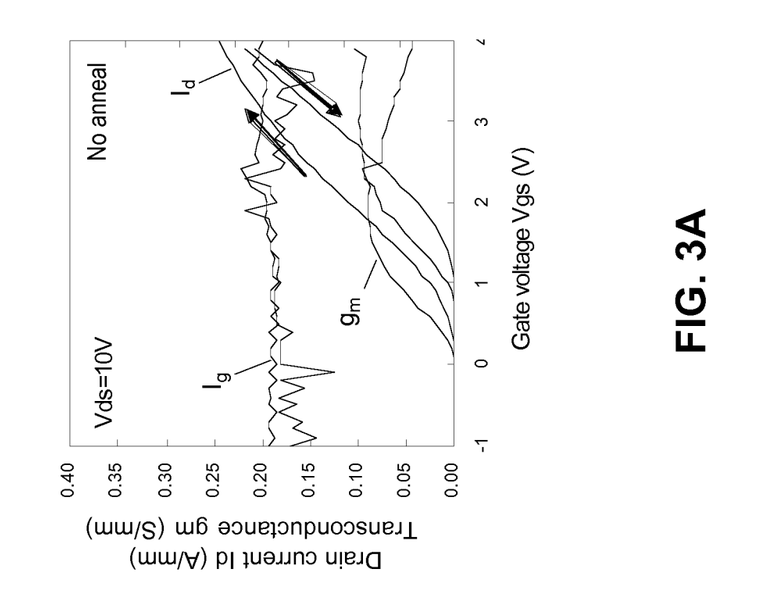
FIG. 3 shows transfer curves comparing characteristics with and without a post deposition anneal (PDA) of the $Al_2O_3$ gate dielectric for a hybrid MOS-HFET in accordance with the present disclosure.
Figure 3B:
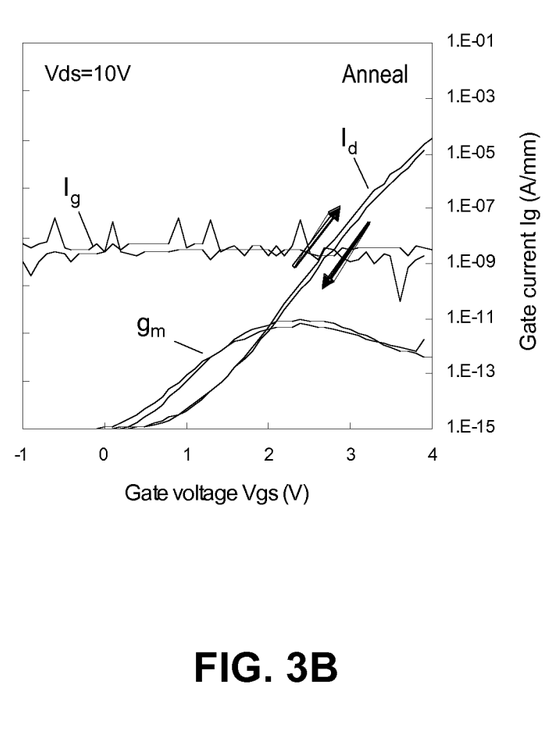

FIGS. 3A and 3B show transfer curves for hybrid MOS-FETs according to the present disclosure. FIG. 3A shows transfer curves for hybrid MOS-FETs fabricated without the post-deposition anneal process described above. FIG. 3B shows transfer curves for hybrid MOS-FETs which underwent a post-deposition anneal (PDA) immediately following the $Al_2O_3$ deposition. The PDA significantly reduced the interface trap density, reflected in reduced threshold voltage hysteresis, as indicated in the up and down arrows in FIGS. 3A and 3B, and also increased the gm and maximum drain current due to an increase in the channel electron mobility.

Figure 4:
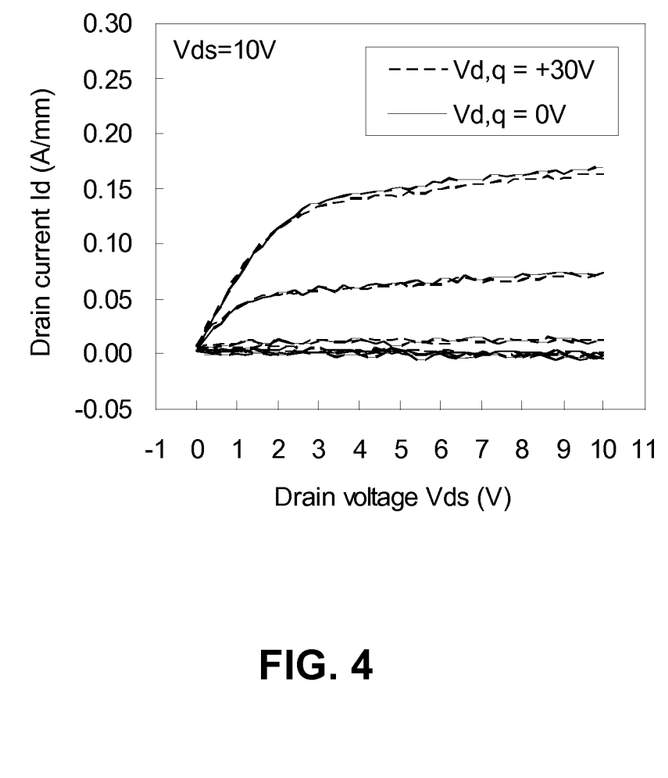
FIG. 4 shows a 200 ns pulsed common-source current voltage measurement of an annealed $Al_2O_3$ hybrid MOS-HFET in accordance with the present disclosure.
Figure 5:
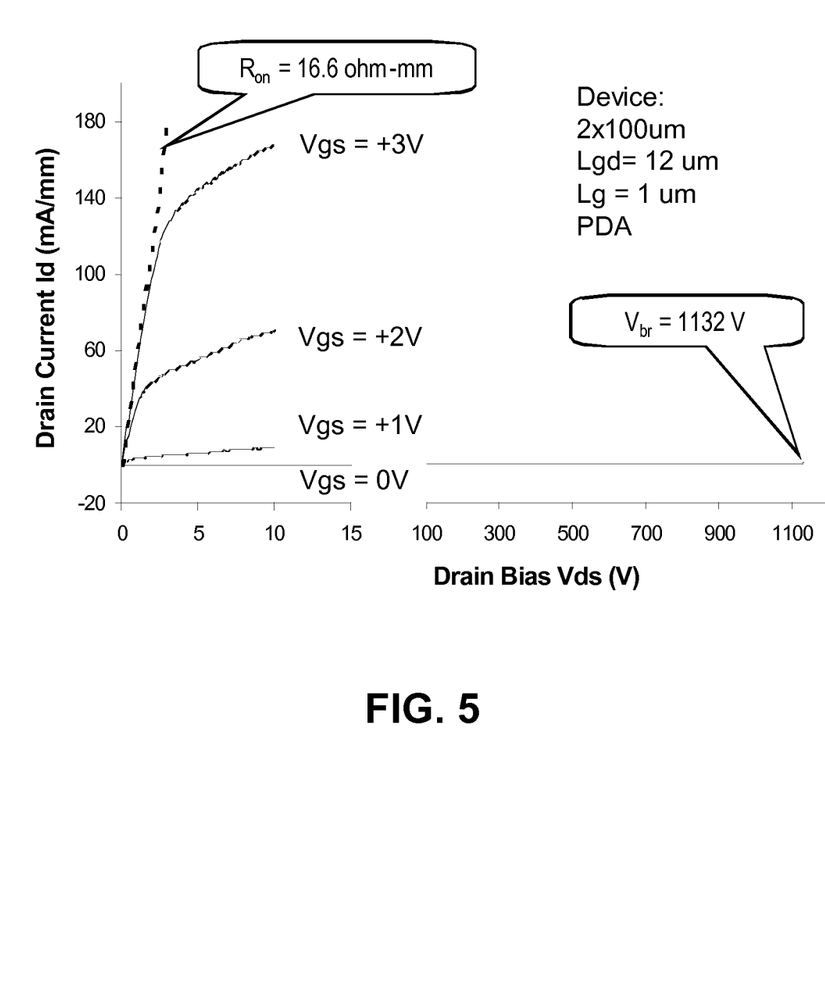
FIG. 5 shows a common-source DC current voltage and zero-bias breakdown measurement of an annealed $Al_2O_3$ hybrid MOS-HFET in accordance with the present disclosure.

FIG. 4 shows the resulting pulsed and DC current voltage for hybrid MOS-FETs according to the present disclosure. The device has very low current collapse at a quiescent bias of Vds=+30V, Vgs=−2V, indicating successful suppression of surface charge trapping by the SiN passivation layer. Common-source DC current voltage and breakdown measurements are shown in FIG. 5. In the embodiment tested the gate periphery was 200 µm and the gate-drain spacing was 12 µm. The on-resistance was measured at Vgs=+3V was 16.6 ohm-mm, while the off-state three-terminal breakdown (measured at zero gate bias) was 1132V. The specific on-resistance was 4.9 mohm-cm$^2$, leading to a high-voltage device figure-of-merit, $Vb^2/R_{on,sp}$, of 261 MW/cm$^2$, which is a good figure of merit for a normally-off GaN device, and is an excellent figure of merit for a normally-off insulated-gate GaN device.

Figure 6:
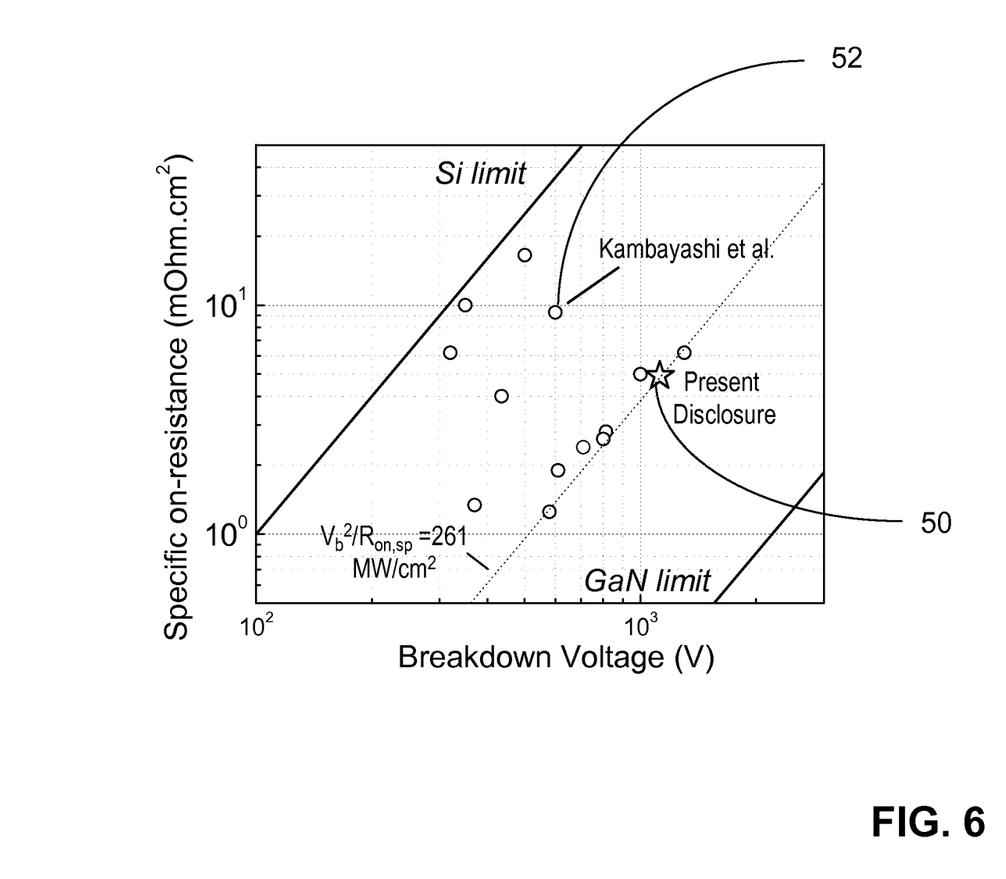
FIG. 6 shows a comparison of a prior art normally-off GaN power device with a hybrid MOS-HFET in accordance with the present disclosure.

FIG. 6 compares this result with results for prior art normally-off GaN devices. The result 50 for a hybrid MOS-HFET of the present disclosure significantly out-performs the result 52 for a prior art hybrid MOS-HFET device with a $SiO_2$ layer used for both a gate dielectric and a passivation layer, as described in H. Kambayashi, Y. Satoh, S. Ootomo, T. Kokawa, T. Nomura, S. Kato, and T. P. Chow, "Over 100 A normally-off AlGaN/GaN hybrid MOS-HFET on Si substrate with high-breakdown voltage", Solid State Elec., vol. 54 issue 6 pp. 660-664 (2010).

Figure 7:
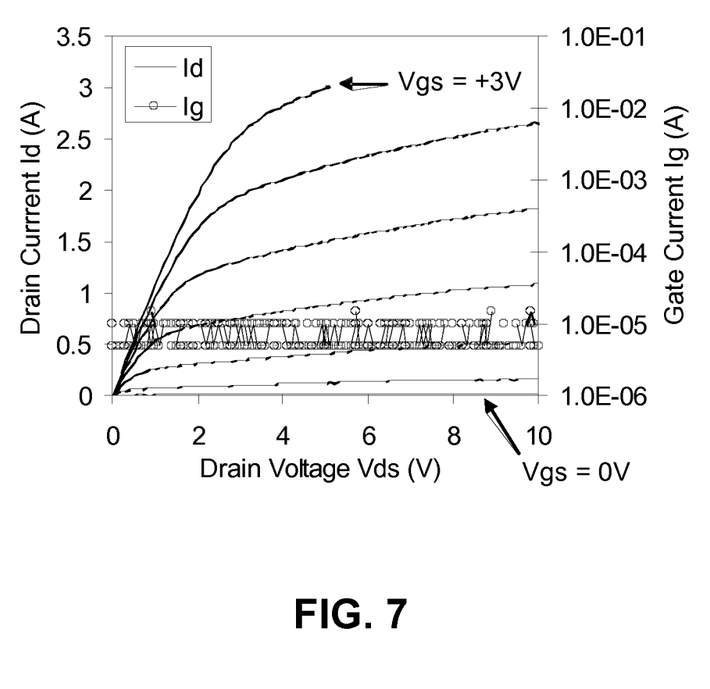
FIG. 7 shows a common-source DC current voltage measurement of an annealed hybrid $Al_2O_3$ MOS-HFET with a gate periphery of 20 mm with the gate biased from +3V in −0.5V steps in accordance with the present disclosure.

FIG. 7 shows common-source DC current and voltage measurements for a larger-periphery (20 mm gate width) device. In these measurements, the maximum drain current is greater than 3 A at a gate bias of +3V, while the gate current is on the order of 10 uA/mm. This demonstrates that large area devices with an ALD $Al_2O_3$ gate dielectric 46 and passivation layer 44 are also feasible. The gate periphery, which is the perimeter of the gate, may range from about 200 µm to as large as 5 meters in length for power electronic applications.

Figure 8:
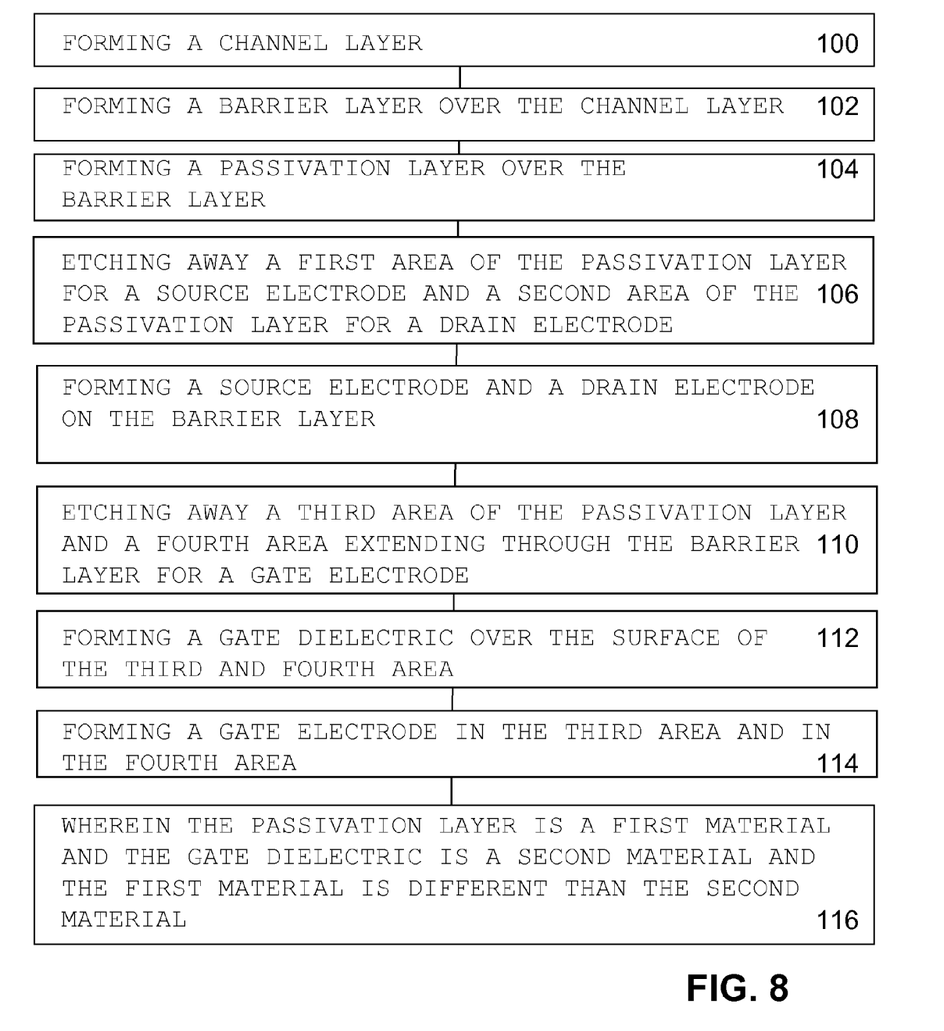
FIG. 8 is a flow diagram of a method of fabricating a hybrid MOS-HFET in accordance with the present disclosure.

FIG. 8 is a flow diagram of a method of fabricating a hybrid MOS-HFET in accordance with the present disclosure. In step 100 a channel layer 38 is formed. Then in step 102 a barrier layer 32 is formed over the channel layer. Next in step 104 a passivation layer 44 is formed over the barrier layer. Then in step 106 a first area of the passivation layer is etched away for a source electrode 40 and second area is etched away for a drain electrode 42. Next in step 108 a source electrode 40 and a drain electrode 42 is formed on the barrier layer. Then in step 110 a third area 47 of the passivation layer and a fourth area 48 extending through the barrier layer for a gate electrode 34 is etched away. Next in step 112 a gate dielectric 46 is formed over the surface of the third and fourth area. Then in step 114 a gate electrode 34 is formed in the third area and in the fourth area. In this method, as described in step 116, the passivation layer is a first material and the gate dielectric is a second material and the first material is different than the second material.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "comprising the step(s) of . . . ."

What is claimed is:

1. A field effect transistor (FET) comprising:
   a source electrode;
   a drain electrode;
   a channel layer;
   a barrier layer over the channel layer and coupled to the source and drain electrodes;
   a gate electrode extending through the barrier layer;
   a passivation layer over the barrier layer for passivating the barrier layer between the gate electrode and the source electrode and between the gate electrode and the drain electrode, wherein the gate electrode extends through the passivation layer; and
   a gate dielectric surrounding the portion of the gate electrode that extends through the barrier layer and the passivation layer;
   wherein the gate dielectric is annealed to improve an interface between the gate dielectric and the channel layer for reducing electron trap density and increasing channel mobility;
   wherein the passivation layer is a first material and the gate dielectric is a second material; and
   wherein the first material is different than the second material.

2. The FET of claim 1 wherein:
   the channel layer is GaN, InN, or InGaN;
   the barrier layer is AlGaN, AlN, AlInN, a combination of AlN spacer and AlGaN barrier, or a combination of AlN spacer and InAlN barrier;
   the passivation layer is SiN, $SiO_2$, $Al_2O_3$, $HfO_2$, $TiO_2$, amorphous AlN, or polycrystalline AlN;
   the gate dielectric is $Al_2O_3$, hafnium oxide ($HfO_2$), titanium oxide ($TiO_2$), SiN, $SiO_2$, amorphous AlN, or polycrystalline AlN.

3. The FET of claim 1 wherein:
   the gate dielectric is formed using atomic layer deposition.

4. The FET of claim 1 wherein:
   the passivation layer is formed using plasma enhanced chemical vapor deposition (PECVD), metal-organic chemical vapor deposition (MOVCD), atomic layer deposition (ALD), molecular beam epitaxy (MBE), e-beam evaporation, or sputtering.

5. The FET of claim 1 wherein the gate dielectric covers the passivation layer.

6. The FET of claim 1 wherein:
   the barrier layer is etched away to the channel layer in a region of the gate electrode using atomic layer etching (ALE).

7. The FET of claim 1 wherein:
   the passivation layer is in the range of 20 to 100 nm thick; and
   the gate dielectric is in the range of 2-20 nm thick.

8. The FET of claim 1 wherein the figure of merit $Vb^2/R_{on,sp}$ is approximately 260 $MW/cm^2$.

9. The FET of claim 1 wherein the channel layer further comprises a polarization induced 2DEG away from the gate electrode.

10. The FET of claim 1 wherein the FET is normally-off when the gate electrode is at zero bias.

11. The FET of claim 1 wherein the FET is a hybrid MOS-HFET.

12. The FET of claim 1 wherein a periphery of the gate is between 200 µm to 20 mm.

13. A method of fabricating a field effect transistor comprising:
    forming a channel layer;
    forming a barrier layer over the channel layer;
    forming a passivation layer over the barrier layer;
    etching away a first area of the passivation layer for a source electrode and a second area of the passivation layer for a drain electrode;
    forming a source electrode and a drain electrode on the barrier layer;
    etching away a third area of the passivation layer and a fourth area extending through the barrier layer for a gate electrode;
    forming a gate dielectric on the surface of the third area and the fourth area;
    annealing the gate dielectric; and
    forming a gate electrode in the third area and in the fourth area;
    wherein the passivation layer is a first material and the gate dielectric is a second material; and
    wherein the first material is different than the second material.

14. The method of claim 13 wherein:
    the channel layer is GaN, InN, or InGaN;
    the barrier layer is AlGaN, AlN, AlInN, a combination of AlN spacer and AlGaN barrier, or a combination of AlN spacer and InAlN barrier;
    the passivation layer is SiN, $SiO_2$, $Al_2O_3$, $HfO_2$, $TiO_2$, amorphous AlN, or polycrystalline AlN;
    the gate dielectric is $Al_2O_3$, hafnium oxide ($HfO_2$), titanium oxide ($TiO_2$), SiN, $SiO_2$, amorphous AlN, or polycrystalline AlN.

15. The method of claim 13 wherein:
    the gate dielectric is formed using atomic layer deposition.

16. The method of claim 13 wherein:
the passivation layer is formed using plasma enhanced chemical vapor deposition (PECVD), metal-organic chemical vapor deposition (MOVCD), atomic layer deposition (ALD), molecular beam epitaxy (MBE), e-beam evaporation, or sputtering.

17. The method of claim 13 wherein the gate dielectric covers the passivation layer.

18. The method of claim 13 further comprising
etching the barrier layer to the channel layer in the fourth area using atomic layer etching (ALE).

19. The method of claim 13 wherein:
the passivation layer is in the range of 20 to 100 nm thick; and
the gate dielectric is in the range of 2-20 nm thick.

20. The method of claim 13 wherein the figure of merit $Vb^2/Ron$ is approximately 260 $MW/cm^2$.

21. The method of claim 13 wherein the channel layer further comprises a polarization induced 2DEG away from the gate electrode.

22. The method of claim 13 wherein the FET is normally-off when the gate electrode is at zero bias.

23. The method of claim 13 wherein the FET is a hybrid MOS-HFET.

24. The method of claim 13 wherein etching away a third area of the passivation layer and a fourth area extending through the barrier layer for a gate electrode comprises atomic layer etching.

* * * * *